US008400820B2

(12) United States Patent
Rimondi et al.

(10) Patent No.: US 8,400,820 B2
(45) Date of Patent: Mar. 19, 2013

(54) ADJUSTABLE IMPEDANCE SRAM MEMORY DEVICE

(75) Inventors: Danilo Rimondi, Mozzo (IT); Donatella Brambilla, Mariano Comense (IT); Rita Zappa, Milan (IT); Carolina Selva, Cologno Monzese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 105 days.

(21) Appl. No.: 12/974,569

(22) Filed: Dec. 21, 2010

(65) Prior Publication Data

US 2011/0157954 A1 Jun. 30, 2011

(30) Foreign Application Priority Data

Dec. 29, 2009 (IT) ............................... MI2009A2322

(51) Int. Cl.
*G11C 11/00* (2006.01)
(52) U.S. Cl. ........................................................ 365/154
(58) Field of Classification Search .............. 365/154 O, 365/154
See application file for complete search history.

(56) References Cited

U.S. PATENT DOCUMENTS

| 4,638,463 | A | * | 1/1987 | Rockett, Jr. ...................... 365/205 |
| 4,956,815 | A | * | 9/1990 | Houston ......................... 365/154 |
| 5,307,142 | A | * | 4/1994 | Corbett et al. ................. 365/156 |
| 6,734,573 | B2 | | 5/2004 | Okada |
| 6,765,817 | B2 | * | 7/2004 | Takemura ....................... 365/154 |
| 7,782,653 | B2 | * | 8/2010 | Hashimoto ..................... 365/154 |
| 7,782,654 | B2 | * | 8/2010 | Hayashi et al. ................. 365/154 |
| 7,983,071 | B2 | * | 7/2011 | Houston ......................... 365/154 |
| 8,111,543 | B2 | * | 2/2012 | Niki et al. ....................... 365/154 |
| 2008/0278993 | A1 | | 11/2008 | Hayashi et al. |
| 2009/0052262 | A1 | | 2/2009 | Nii |

FOREIGN PATENT DOCUMENTS

| FR | 2927722 | 8/2009 |
| WO | 2009122579 | 10/2009 |

OTHER PUBLICATIONS

Search Report based on Italian Application Serial No. MI20092322, Ministero dello Sviluppo Economico, Apr. 21, 2010, pp. 3.

* cited by examiner

*Primary Examiner* — VanThu Nguyen
(74) *Attorney, Agent, or Firm* — Graybeal Jackson LLP

(57) ABSTRACT

An embodiment of a memory device includes a plurality of memory cells; each memory cell includes a latch adapted to store an information bit. Said latch includes a first logic gate including a first input terminal and a first output terminal and a second logic gate including a second input terminal and a second output terminal. Said first input terminal is connected to said second output terminal and said first output terminal is connected to said second input terminal. The memory device further includes reading and writing means adapted to perform a read operation or a write operation of the information bit. Said first logic gate includes a pull-up branch coupled between a terminal for providing a supply voltage and the first output terminal, and a pull-down branch coupled between the first output terminal and a terminal for providing a reference voltage. Said second logic gate includes a pull-up branch coupled between a terminal for providing the supply voltage and the second output terminal, and a pull-down branch coupled between the second output terminal and a terminal for providing the reference voltage. Said memory device includes variation means adapted to selectively vary a gain factor of at least one between the pull-down branch and the pull-up branch of said first logic gate and second logic gate depending on the operation performed by the reading and writing means.

26 Claims, 8 Drawing Sheets

FIG.2 - Background Art

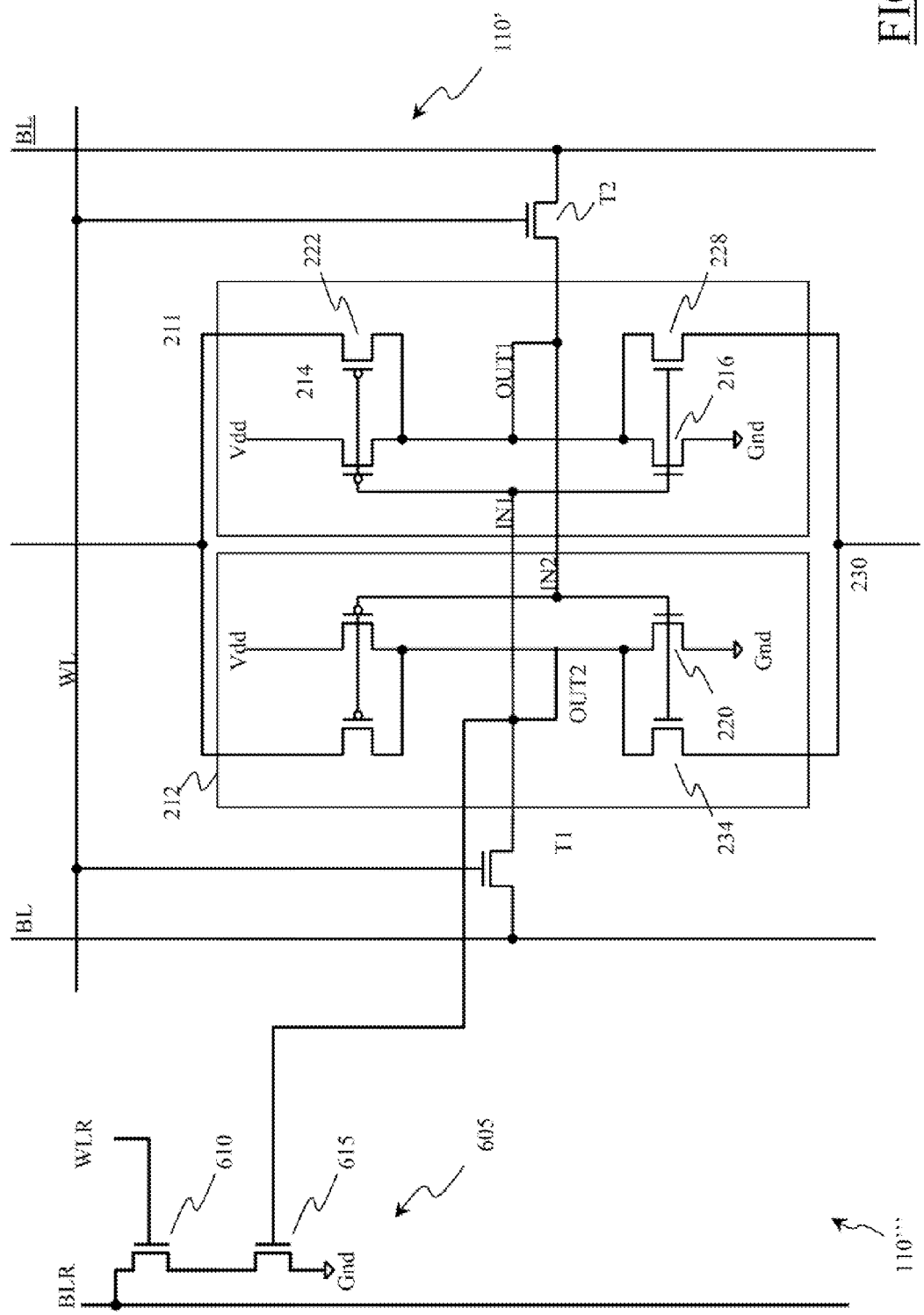

ADJUSTABLE IMPEDANCE SRAM MEMORY DEVICE

PRIORITY CLAIM

The instant application claims priority to Italian Patent Application No. MI2009A002322, filed Dec. 29, 2009, which application is incorporated herein by reference in its entirety.

TECHNICAL FIELD

An embodiment relates to the electronic field. More specifically, an embodiment relates to a static random access memory.

The increasing spread of portable electronic devices powered by batteries has recently highlighted a number of issues relating to electric power consumption and battery life.

Referring in particular to SOC ("System On Chip") integrated systems, in which a whole electronic system is integrated into a single chip, the electric power consumption may be reduced by scaling the values of the supply voltages used to supply the various parts of such electronic system.

One of the key components of a present SOC system is represented by the main memory, which may be implemented by means of static random access memory.

BACKGROUND

A random access memory (RAM) is a particular type of electronic memory wherein each memory address may be directly accessed with a same access time. A binary RAM memory includes an array of memory cells, each one of which is capable of storing a binary information or a bit (that is the logical value "0" or "1"), and corresponding peripheral circuits, which in general accomplish management and access functions for each memory cell.

A static RAM memory cell (SRAM) is a type of volatile RAM memory that does not require any operation for the refresh of the stored data, since the information is stored for a theoretically infinite time (until the shutdown of the electronic system in which such memory is implemented); SRAM memories are often characterized by reduced read times and relatively low power consumption, especially in static conditions.

The reference SRAM memory cell presently used in CMOS technologies includes six transistors, and for this reason it is usually referred to as "6T" memory cell. In particular, a 6T memory cell includes a latch formed by two crossed logic inverters and two access transistors adapted to selectively couple the internal nodes of the latch with a respective pair of bit lines depending on the voltage value of a respective word line. The binary information being stored in the 6T memory cell is given by the voltage values of the internal nodes of the latch. The bit lines are usually brought to a precharge voltage equal to the supply voltage of the memory.

In order to access a 6T memory cell for reading the stored data therein, the voltage of the word line corresponding to the cell is increased to a value corresponding to the supply voltage, so as to enable the two access transistors. In this situation, the bit line connected to the internal node of the latch at the low (ground) voltage value is discharged, while the bit line connected to the internal node of the latch at the high voltage (the supply voltage) stays charged. The voltage difference developing between the two bit lines is then detected by a sense amplifier and converted into a logical value.

The write access to the 6T memory cell is instead performed by bringing one of the two bit lines being associated to the cell down to a low voltage (ground) and then bringing the corresponding word line up to a high voltage (the supply voltage). In this way the internal node of the latch connected to the bit line that has been brought to ground is decreased down to the ground voltage, while the other internal node is increased up to the supply voltage.

However, in a SRAM memory whose cells are of the type just described, it may not be possible to scale the voltage supply by such a quantity to allow a satisfactory reduction in the electric power consumption without incurring in drawbacks that may affect the correct operation thereof.

Such limitation is due to the fact that in a 6T memory cell both the read access and the write access are performed through a same access circuit, being formed by the two access transistors. The fact that such access transistors are used for both reading and writing may make it impractical or impossible to achieve optimal operating conditions in both cases. In fact, during a read operation, it may be desired that the access transistors have a relatively high conduction resistance in order to prevent spurious switchings in the latch and to increase the stability of the cell, while in a write operation it may be desired that such transistors have a sufficiently small conduction resistance to ensure a correct switching of the latch when one of the two bit lines associated with the cell is brought to the ground voltage. In other words, in such a way that both the read noise margins and the write noise margins of a same 6T memory cell turn out to be sufficiently wide, the access transistors of such cell would need to meet conflicting constraints. Such conflicting constraints greatly reduce the tolerance range of the parameters used during the manufacturing process of the SOC system in which a SRAM memory is integrated, thereby bringing down the yield of production. This problem is more evident when the supply voltage of the SOC system, and thus of the SRAM memory, is decreased, since a reduced supply voltage greatly reduces the noise margins.

Reduced noise margins invalidate a correct operation of the memory cell because they do not ensure neither an ideal operation of the latch thereof, nor a good tolerance to spurious switchings caused by alterations in the transfer of electrical signals (for example, voltage glitches).

In addition, a memory cell having reduced noise margins may be affected by so-called indirect access noises. In particular, a noise of such type may occur when the word line of the row wherein there is placed a given memory cell (involved in a read or write operation) is enabled: since each word line is shared by all the memory cells of the corresponding row, enabling a word line implies the selection of cells being not involved in the write or read operation, thereby causing, under unfavorable polarization conditions of the corresponding bit lines, a possible alteration of their logical content (that is, an unwanted write operation).

SUMMARY

In order to increase the noise margins of a 6T memory cell, several solutions have been proposed.

According to a first solution, the noise margins of a SRAM memory being integrated into a SOC system are widened by providing a dedicated second power supply for the SRAM memory within the system, with a value being greater than that of the voltage that supplies the rest of the system. A solution of this type may turn out to be expensive, since it provides for the introduction of a dedicated second supply line.

Another approach is to change dynamically the polarization conditions of the memory cells according to the operation to which the cell is subjected. Such approach may not be optimal as it would require a careful management of the voltages, thereby involving an excessive increase in the design complexity.

A still further solution is to modify the structure of the SRAM memory cell, by introducing a further access port including two transistors (for this reason, such architecture is called "8T"), which is used exclusively for reading. The write operation is performed instead by using the 6T classical structure, whose access transistors are designed for having a reduced conduction resistance and hence optimal write noise margins. In this way, by decoupling the read operation from the write operation, correspondingly also the parameters on which to act for setting the read and write noise margins turn out to be substantially decoupled. Therefore, the read noise margins and the write noise margins may be optimized by acting on characteristic parameters (typically, the size) of the additional port and of the latches, respectively, without having to incur in unfavorable trade-off conditions. Moreover, the 8T memory cell may have a read operation speed being greater than that of the classic 6T memory cell, because the latch and the access transistors are not used for such operation.

However, the use of an 8T memory cell may not overcome satisfactorily the above-cited drawback about the indirect access noise, that is the possibility of causing spurious writings in unselected memory cells. In fact, due to the additional access port decoupled from the latch, the extent of such noise may be reduced (with respect to a 6T memory cell) only during the read operation, but not during the write operation. Indeed, in the lower and lower voltage applications (such as the todays' applications), the 8T memory cell, during a write operation of a selected cell, may suffer even more heavily from the indirect access noise, since the transistors of the additional access port may further limit the maximum allowable noise margins for ensuring the correct operation of the port (that is for avoiding unwanted switching thereof). For this reason, nowadays the 8T memory cells are used almost exclusively in SRAM architectures called "page word", wherein each row of the array includes a single word; in this way, since each 8T memory cell of the same word is processed concurrently, there will be no distinction between selected memory cells and unselected memory cells in the same row of the array.

However, the use of "page-word" architectures makes the 8T memory cells particularly vulnerable to so-called "soft error" events, such as the "Single Event Upset" (SEU), that is an inversion of the logical value stored in a memory cell caused by cosmic radiation particles, or the "Multiple Bit Upset" (MBU), that is a plurality of such inversions of the stored logic value. Errors due to such events may be corrected through soft error correction techniques called ECC (Error Correction Code), which, however, may be able to correct accurately no more than one bit per word. It is clear that, being the "page word" SRAM architecture formed by one word per row, the occurrence of a plurality of soft errors (such as in the case of MBU) in a row of the array may affect a corresponding plurality of bits of the same word, and therefore the ECC technique may be unable to ensure the correction thereof. On the other hand, the use of memory cells in a "page word" SRAM architectures may not exploit optimally the area occupation of the electronic device or, equivalently, may not allow obtaining SRAM memories with high-storage capacity relative to a given occupation area.

It has been noticed that none of the above proposed solutions is able to provide a SRAM memory with sufficiently wide read and write noise margins for use in low-supply voltages applications.

In this regard, an embodiment proposes a memory device that includes a plurality of memory cells; each memory cell includes a latch adapted to store an information bit. Said latch includes a first logic gate including a first input terminal and a first output terminal and a second logic gate including a second input terminal and a second output terminal. Said first input terminal is connected to said second output terminal and said first output terminal is connected to said second input terminal. The memory device further includes reading and writing means adapted to perform a read operation or a write operation of the information bit. Said first logic gate includes a pull-up branch coupled between a terminal for providing a supply voltage and the first output terminal, and a pull-down branch coupled between the first output terminal and a terminal for providing a reference voltage. Said second logic gate includes a pull-up branch coupled between a terminal providing the supply voltage and the second output terminal, and a pull-down branch coupled between the second output terminal and a terminal for providing the reference voltage. Said memory device includes variation means adapted to selectively vary a gain factor of at least one between the pull-down branch and the pull-up branch of said first logic gate and second logic gate depending on the operation performed by the reading and writing means.

An embodiment also relates to a memory cell.

A further embodiment relates to a method for operating a memory device.

BRIEF DESCRIPTION OF THE DRAWINGS

One or more embodiments, as well as features and advantages thereof, will be best understood with reference to the following detailed description, given purely by way of a non-restrictive indication, to be read in conjunction with the accompanying drawings (wherein corresponding elements are denoted with equal to similar references, and their explanation is not repeated for the sake of exposition brevity, and the name of each entity may generally be used to indicate both its type and its attributes—such as its value, content and representation—for simplicity). In particular:

FIG. 7 is a schematic representation of a memory cell included in the memory device of FIG. 1 according to another embodiment.

DETAILED DESCRIPTION

Figure 1:
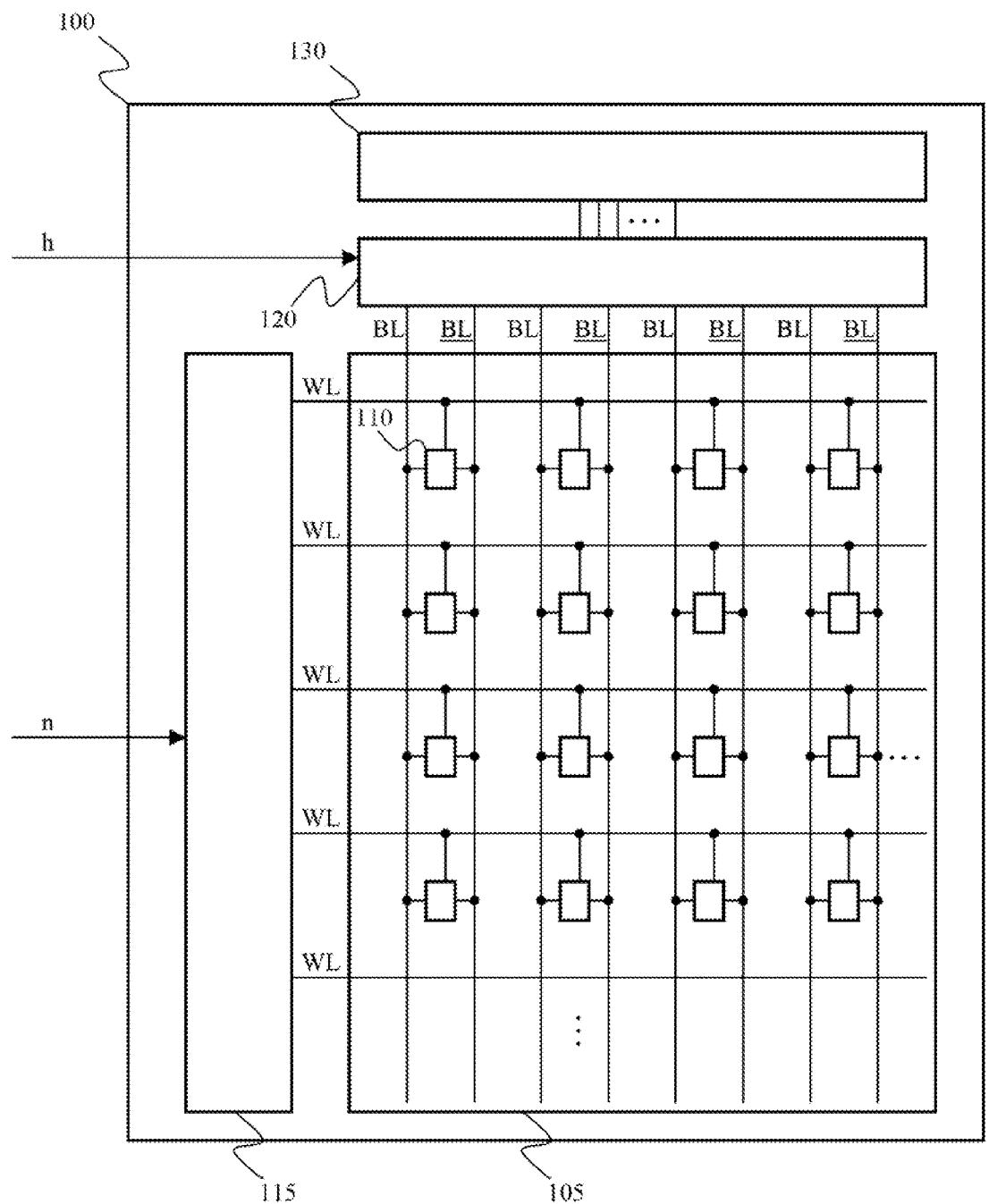
FIG. 1 is a schematic representation of a memory device in which an embodiment may be applied.

With particular reference to FIG. 1, there is shown a schematic representation of a memory device 100 in which an embodiment may be applied. In particular, the memory device 100 is of the SRAM type. The memory device 100 includes an array 105 of memory cells 110, which is arranged in rows and columns. Each memory cell 110 is able to store one information bit. Normally, the memory device 100 processes concurrently (in writing and reading) words of a determined number of bits, which are stored in corresponding memory cells 110 of a same row (for example, 8 memory cells 110 for a word of 8 bits).

The array 105 also includes a plurality of main bit lines BL alternated with complementary bit lines BL, and a plurality of word lines WL. Each memory cell 110 of a same column of the array 105 is connected to a same bit line pair BL, BL, while each memory cell 110 of a same row of the array 105 is connected to a same word line WL. Each word is selected (in reading and writing) through a corresponding address formed by a row address n associated with a single word line WL and a column address h associated with a group of bit line pairs BL, BL (in the considered example, eight pairs). The selection of the word line WL of the selected word is carried out through a row decoder 115, which enables the word line WL corresponding to the row address n. The selection of the bit line pairs BL, BL is instead carried out by means of a column multiplexer 120; the column multiplexer 120 selects the bit line pairs BL, BL of the selected word depending on the value of the input column address h. In such way, each memory cell 110 of the selected word (to be read or written) is selected through the enabled word line WL and the corresponding enabled bit lines pair BL, BL.

The column multiplexer 120 interfaces with a read/write circuit 130. During a read operation, the read/write circuit 130 is adapted to receive the bits being stored in the selected memory cell 110 (through the corresponding main bit lines BL) and the same complementary bits (through the corresponding complementary bit lines BL) and outputs the bits stored in the selected memory cell 110. During a write operation, the read/write circuit 130 directly provides to the selected bit line BL and through a logic inverter (not shown) to the complementary bit lines BL the bits to be written into the selected memory cells 110.

Figure 2:
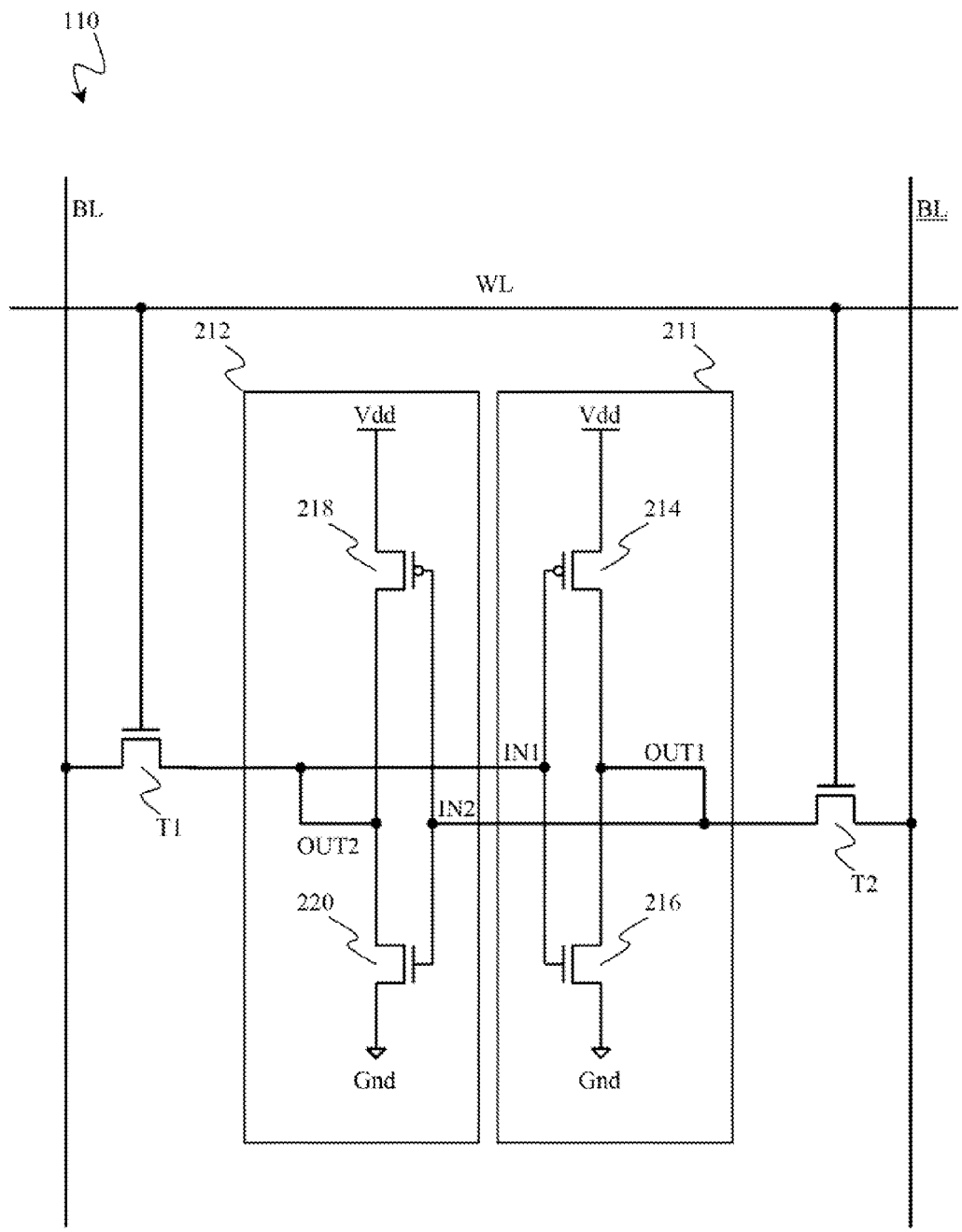
FIG. 2 is a schematic representation of a memory cell included in the memory device of FIG. 1 according to an embodiment.

Turning now to FIG. 2, there is shown a schematic representation of a conventional memory cell 110; in particular, the memory cell 110 illustrated in the figure is a 6T memory cell. The memory cell 110 includes two NOT logic gates (logic inverters) 211 and 212; each NOT logic gate 211, 212 includes an input terminal IN1, IN2 and an output terminal OUT1, OUT2, which provides an inverted signal with respect to a signal applied at the input terminal IN1, IN2. The logic gate 211 includes a P-channel MOS transistor 214 (pull-up branch) having a source terminal connected to a terminal for receiving a supply voltage Vdd, a control terminal connected to the input terminal IN1 and a drain terminal connected to the output terminal OUT1; the logic gate 211 also includes an N-channel MOS transistor 216 (pull-down branch) having a drain terminal connected to the output terminal OUT1, a control terminal connected to the input terminal IN1 and a source terminal connected to a terminal that provides a reference voltage (ground) Gnd. The logic gate 212 includes a P-channel MOS transistor 218 (pull-up branch) having a source terminal connected to a terminal to receive the supply voltage Vdd, a control terminal connected to the input terminal IN2 and a drain terminal connected to the output terminal OUT2; the logic gate 212 also includes an N-channel MOS transistor 220 (pull-down branch) having a drain terminal connected to the output terminal OUT2, a control terminal connected to the input terminal IN2 and a source terminal connected to a terminal providing the ground voltage Gnd.

The NOT logic gates 211, 212 are connected to each other in positive feedback; in detail, the output terminal OUT1, OUT2 of each NOT logic gate 211, 212 is coupled to the input terminal IN2, IN1 of the other NOT logic gate 212, 211. In such way, the memory cell 110 has two stable conditions. In particular, when the output terminal OUT1 is at a voltage corresponding to the logic value 1 (for example, the supply voltage Vdd) and the output terminal OUT2 is at a voltage corresponding to the logic value 0 (for example, the ground voltage Gnd), the memory cell 110 stores the logic value 0; on the contrary, when the output terminal OUT1 is at the voltage corresponding to the logic value 0 and the output terminal OUT2 is at the voltage corresponding to the logic value 1, the memory cell 110 stores a logic value 1.

The memory cell 110 also includes two MOS transistors T1 and T2 (for example, of N-channel type); the transistor T1 includes a first conduction terminal coupled to the corresponding main bit line BL, a second conduction terminal coupled to the input terminal IN1 of the NOT logic gate 211 (and hence to the output terminal OUT2 of the NOT logic gate 212) and a control terminal coupled to the corresponding word line WL. Similarly, the transistor T2 includes a first conduction terminal coupled to the corresponding complementary bit line BL, a second conduction terminal coupled to the input terminal IN2 of the NOT logic gate 212 (and hence to the output terminal OUT1 of the NOT logic gate 211) and a control terminal coupled to the word line WL.

The operation of the memory cell 110 may be summarized as follows. In a stand-by condition the word line WL is not enabled (for example, at the ground voltage Gnd); therefore, the transistors T1, T2 are turned off and the two NOT logic gates 211 and 212 are isolated from the main bit line BL and the complementary bit line BL, respectively. In such way, the memory cell 110 maintains its status unmodified (and thus the stored bit).

In case of writing of a bit in the memory cell 110, the main bit line BL and the complementary bit line BL are pre-charged to the voltage value of the bit to be written and to its negated logic value, respectively; then the word line WL is enabled, so that the transistors T1, T2 come into conduction thereby coupling the terminals IN1, OUT2 with the main bit line BL and the terminals IN2, OUT1 with the complementary bit line BL; in this way, the memory cell 110 moves to the condition corresponding to the bit to be written; by deselecting the word line WL, the written bit remains stored in the memory cell 110 until a new write operation on it (or until the shutting down of the memory device).

When the memory cell 110 is selected during a (differential) read operation, both the main bit line BL and the complementary bit line BL are pre-charged to a predetermined voltage value (for example, the supply voltage); the word line WL is then enabled (for example, at the voltage supply), so that the transistors T1 and T2 come into conduction, thereby coupling the terminals IN1, OUT2 with the main bit line BL and the terminals IN2, OUT1 with the complementary bit line BL, respectively. In this way, depending on whether the memory cell 110 stores the logic value 0 or the logic value 1, the main bit line BL or the complementary bit line BL, respectively, will begin to discharge and the read/write circuit will detect a voltage difference between the two bit lines BL and BL; the polarity of such voltage difference, positive or negative depending on whether the main bit line BL or the complementary bit line BL discharges, allows determining the bit stored in the memory cell 110 (logic 1 or logic 0, respectively).

As described above, a SRAM memory cell of the type shown in FIG. 2 may be unable to ensure sufficiently wide read and write noise margins in low-supply-voltage applications.

In its general terms, an embodiment provides for varying the gain factor ($\beta$) of the of pull-up and pull-down branches of the NOT logic gates forming the latch of the cell in a dynamic manner, depending on the operation to which the cell is subjected. In particular, an embodiment provides for the selective introduction of additional transistors in parallel with the transistors forming the NOT logic gates on the basis of the operation (read/write) to which the memory cell is subjected.

Figure 3:
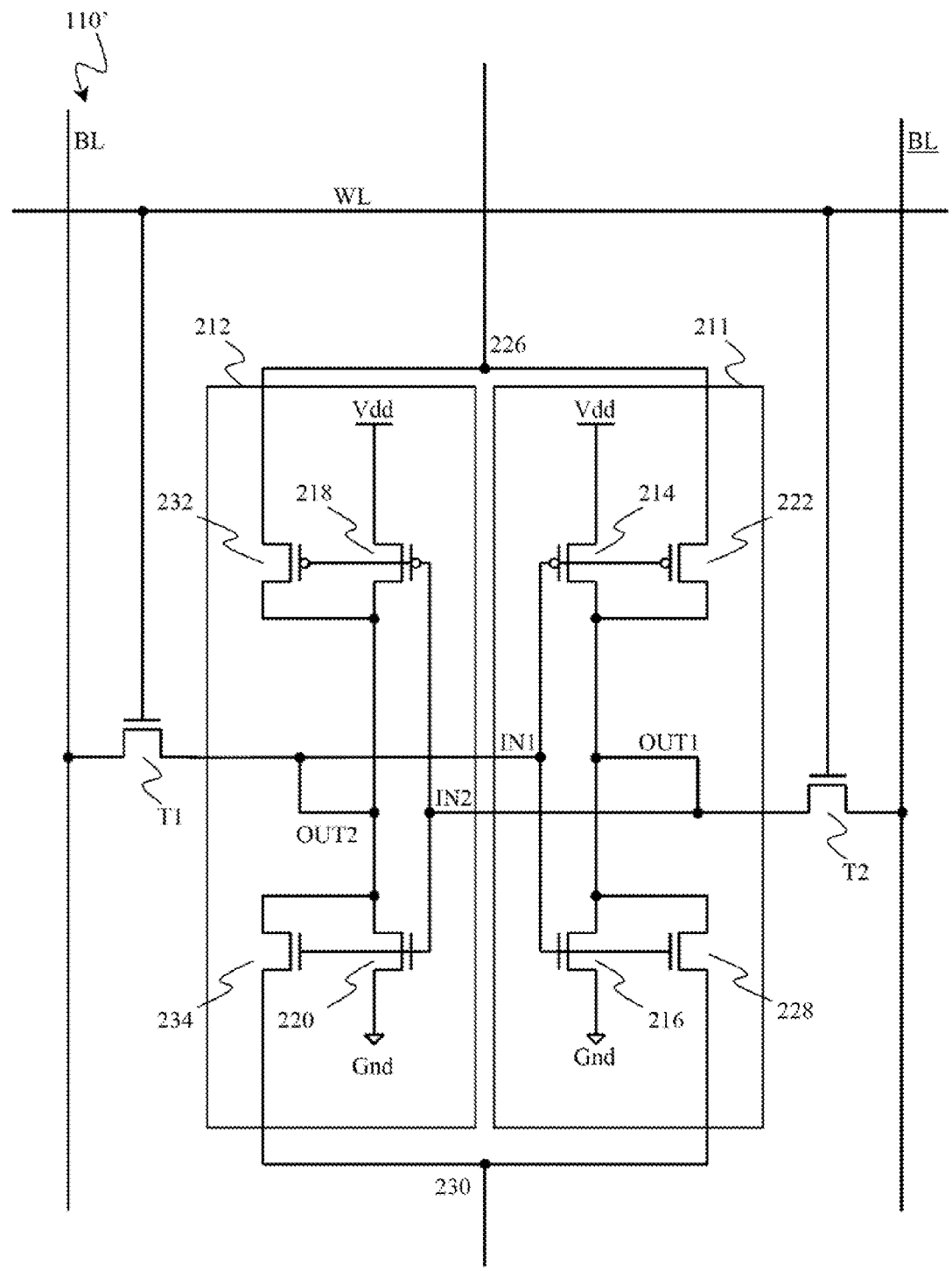
FIG. 3 is a schematic representation of a memory cell included in the memory device of FIG. 1 according to an embodiment.

In FIG. 3 there is illustrated a SRAM memory cell according to an embodiment, identified by the reference 110'. The elements of the memory cell 110' corresponding to those of the memory cell 110 are identified with the same references being used in FIG. 2 and they will not be discussed here in detail, since they accomplish the same functions.

According to such embodiment, the NOT gate 211 has two additional transistors selectively connectable in parallel with the transistors 214 and 216. In particular, a first additional transistor—a P-channel MOS transistor, identified in the figure with the reference 222—has a drain terminal connected to the terminal OUT1, a control terminal connected to the control terminal of the transistor 214, and a source terminal connected to a first additional supply line 226; said first additional supply line 226 is shared by all the other memory cells belonging to the column of the array 105 in which the memory cell 110' is included. A second additional transistor—an N-channel MOS transistor, identified in the figure with the reference 228—has a drain terminal connected to the terminal OUT1, a control terminal connected to the control terminal of the transistor 216 and a source terminal connected to a second additional second supply line 230; in the same way as the first supply line 226, said second additional supply line 230 as well is shared by all the other memory cells belonging to the column of the matrix 105 in which the memory cell 110' is included.

In a similar manner to the NOT logic gate 211, the NOT logic gate 212 has two additional transistors selectively connectable in parallel with the transistors 218 and 220. In particular, a first additional transistor—a P-channel MOS transistor, identified in the figure with the reference 232—has a drain terminal connected to the terminal OUT2, a control terminal connected to the control terminal of the transistor 218, and a source terminal connected to the first additional supply line 226. A second additional transistor—an N-channel MOS transistor, identified in the figure with the reference 234—has a drain terminal connected to the terminal OUT2, a control terminal connected to the control terminal of the transistor 220 and a source terminal connected to the additional second power supply line 230.

Figure 4:
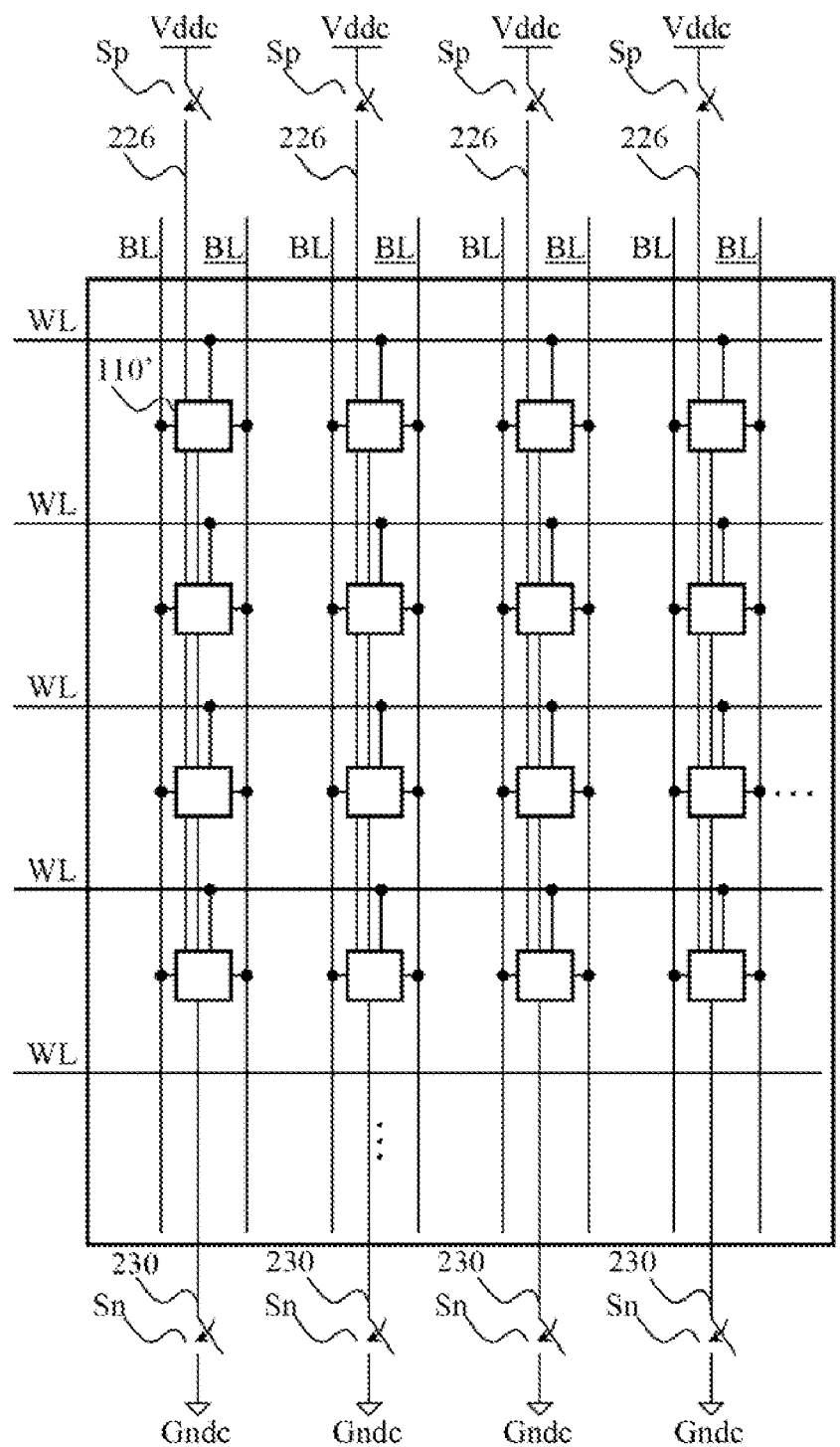
FIG. 4 is a schematic representation of the structure of a memory array included in the memory device of FIG. 1 according to an embodiment.

According to an embodiment illustrated in FIG. 4, the first supply line 226 of each column is selectively coupleable to a terminal that receives a column supply voltage Vddc through a respective controlled switch Sp. At the same way, the second supply line 230 of each column is selectively coupleable to a terminal that receives a column ground voltage Gndc through a respective controlled switch Sn.

During a read operation, the controlled switches Sp and Sn associated with the columns of the array 105 including the memory cells 110' to be accessed are closed. In this configuration, the gain factors of the pull-up and pull down branches of the NOT logic gates 211 and 212 turn out to be increased thanks to the contribution of the additional transistors 222, 228, 232 and 234. In particular, the gain factors of the pull-up and pull down branches of the NOT logic gate 211 turn out to be increased since the pull-up branch is formed by the parallel connection of the transistors 222 and 214, while the pull-down branch is formed by the parallel connection of the transistors 228 and 216. In the same way, the gain factors of the pull-up and pull down branches of the NOT logic gate 212 turn out to be increased since the pull-up branch is formed by the parallel connection of the transistors 232 and 218, while the pull-down branch is formed by the parallel connection of the transistors 234 and 220. In this way, the switching threshold voltage of the latch of the memory cell 110' is increased, thereby making the latch more stable and increasing the read noise margins.

On the contrary, during a write operation, the controlled switches Sp and Sn are opened, thereby excluding the contribution of the additional transistors 222, 228, 232 and 234. In this situation, the pull-up branch of the NOT logic gate 211 turns out to be formed by the single transistor 214, while the pull-down branch turns out to be formed by the single transistor 216; at the same way, the pull-up branch of the NOT logic gate 212 is to be formed by the single transistor 218, while the pull-down branch turns out to be formed by the single transistor 220. In this way, the gain factors of the pull-up and pull down branches of the NOT logic gates 211 and 212 turn out to be lower with respect to the case of read operation, while the switching threshold voltage of the latch of the memory cell 110' is maintained at a sufficiently high value. In other words, in this condition the write noise margins of the selected cell turn out to be increased, and the cells are more tolerant with respect to possible spurious switching caused by alterations in the transfer of electric signals.

Another embodiment relates to the state of the controlled switches Sn and Sp, depending on the operation state of the memory device.

In particular, in a stand-by operation state, i.e. when the memory device is not involved in any read or write operation, all the controlled switches Sn and Sp are opened, so as not to unnecessarily waste unrequired power.

During the writing of a selected memory cell, the controlled switches Sn and Sp corresponding to such memory cell are kept opened, so as to increase or maximize the noise margins of the cell in the write operation (as described above), while all the other controlled switches of the memory cell (within the same row of the selected memory cell) being not selected (that is, not involved in the write and read operation) are closed. In this way, since the unselected memory cells have high noise margins, they will be substantially immune to indirect access noises (described above) during the write operation.

During the reading of a selected memory cell, both the controlled switches Sn and Sp corresponding to such memory cell and all the other controlled switches of the memory cells (within the same row of the selected memory cell) being not selected (that is, not involved in the read operation) are closed. In this way, during the read operation the selected cell will have maximized noise margins, and the unselected memory cells, having high noise margins too, will be substantially immune to indirect access noises (described above).

Therefore, by driving the controlled switches in this way, it may be possible to limit significantly the number of occurrences spurious writing in the unselected memory cells for a determined operation.

Figure 5A:
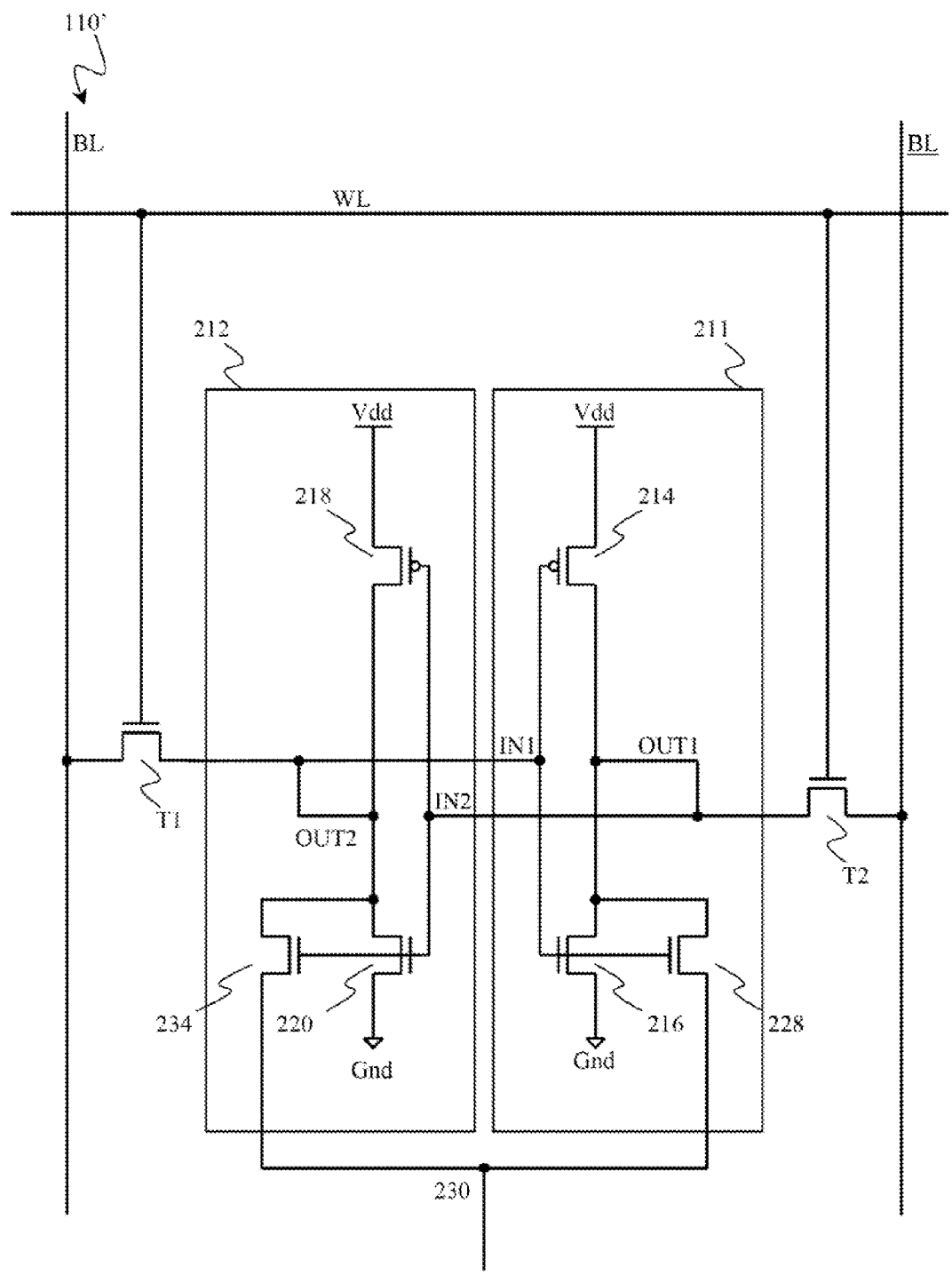
FIG. 5A is a schematic representation of a memory cell included in the memory device of FIG. 1 according to an alternative embodiment.
Figure 5B:
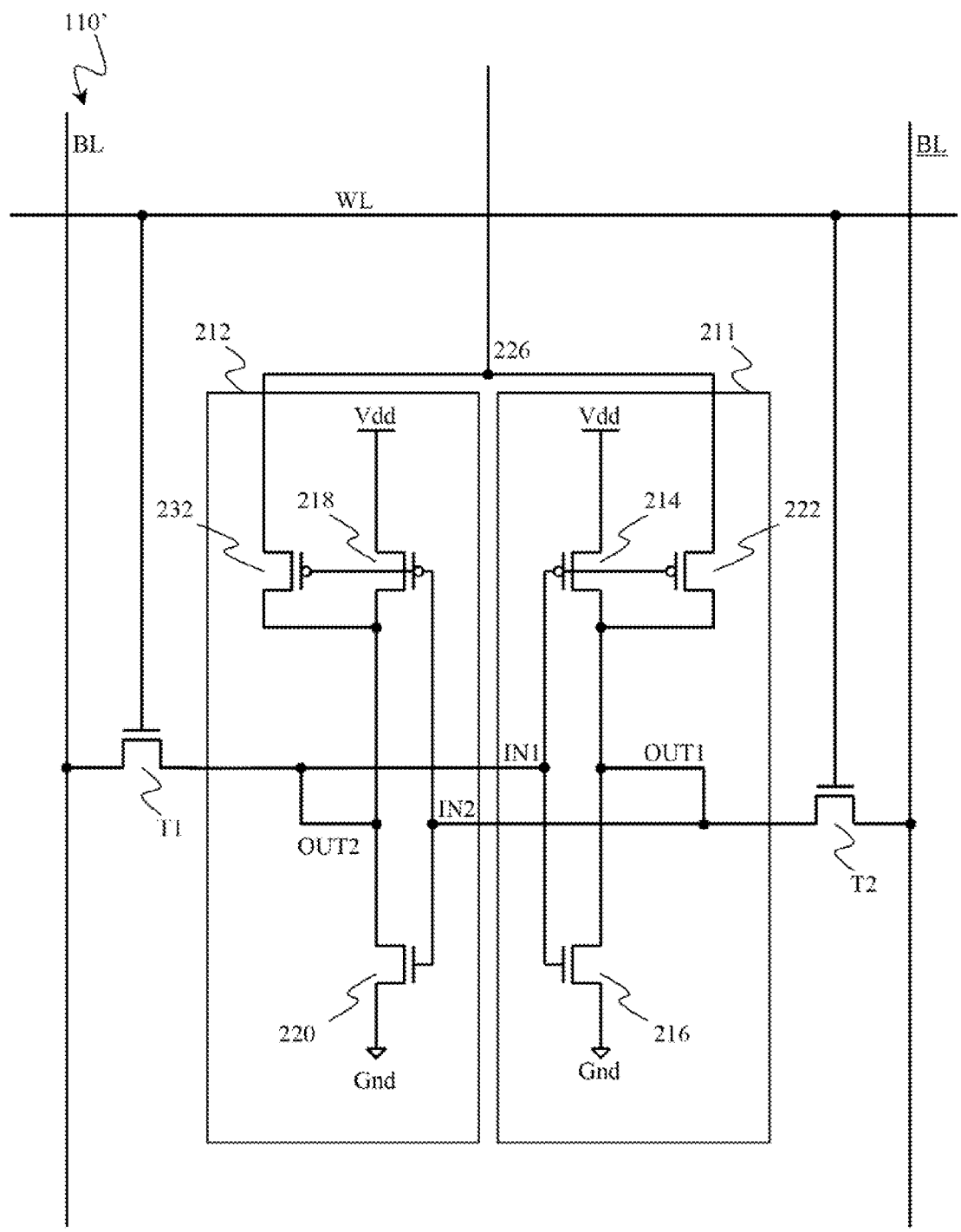
FIG. 5B is a schematic representation of a memory cell included in the memory device of FIG. 1 according to further alternative embodiment.

According to a further embodiment, it may be possible to provide for additional transistors only in the pull-down branches (see FIG. 5A) or in the pull-up branches (see FIG. 5B) of the NOT logic gates 211 and 212. In the first case, the first additional supply line 226 and the controlled switch Sp are not provided, while in the second case the second additional supply line 230 and the controlled switch Sn are not provided; in both cases, the transistors included in the pull-up/pull-down branches having no additional transistors are sized in a proper manner so that the ratio between the gain factor of the pull-up branch and of the pull-down branch is such to ensure stability to the latch. Even for such further embodiments the above considerations concerning the control of the switches Sn and/or Sp are valid.

According to an embodiment (not shown), the gain factor of at least one of the pull-up and pull down branches of a NOT logic gate may be varied by using more than one additional transistor to be inserted in parallel with the transistor that forms such branch. The same considerations about the control of the controlled switches apply to such embodiment as well.

Figure 6:
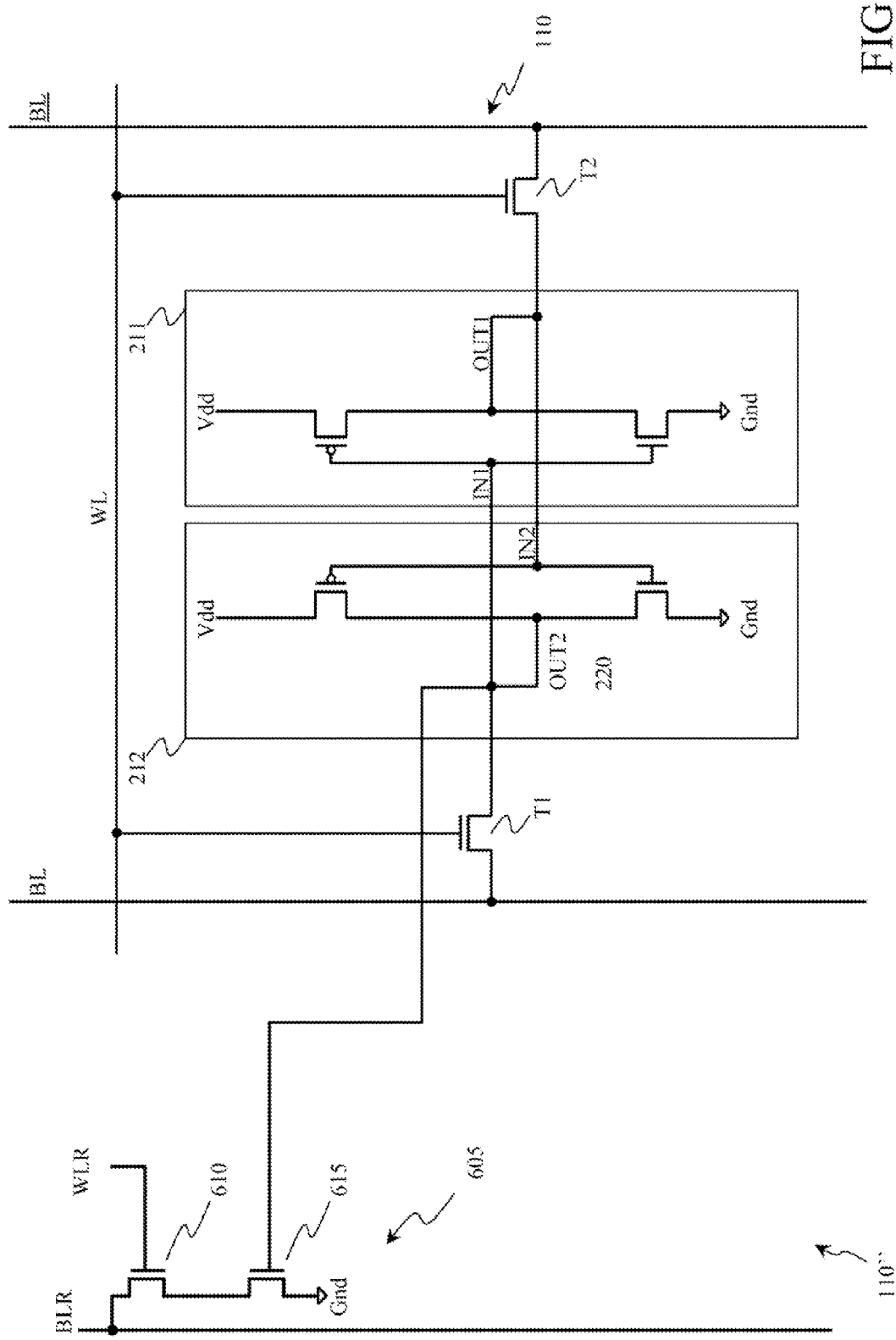
FIG. 6 is a schematic representation of a memory cell included in the memory device of FIG. 1 according to a further embodiment.

FIG. 6 illustrates in detail the structure of a conventional 8T memory cell—identified with the reference 110"—adapted to be used in the memory device of FIG. 1. In particular, the memory cell 110" includes an equivalent structure to the memory cell 110 and an additional port 605, which is used during read operations (as will be explained below); such additional port 605 includes a transistor 610 and a transistor 615, for example, both of N-channel MOS type.

Each 8T memory cell of a same column of the array (not shown in the figure) is associated with a same additional bit line BLR, while each 8T memory cell of a same row of the array is associated with a same additional word line WLR; each pair of additional bit line BLR and additional word line WLR intercepts and, if enabled, selects a corresponding 8T memory cell of the array for carrying out the reading.

The transistor 610 has the drain terminal connected to the corresponding additional bit line BLR and the source terminal connected to the drain terminal of the transistor 615; the source terminal of the transistor 615 is instead connected to a terminal providing the ground voltage of the system. The control terminal of the transistor 610 is connected to the corresponding additional word line WLR, while the control terminal of the transistor 615 is connected to the node IN1 (and hence to the node OUT2) of the latch including the NOT logic gates 211 and 212.

The operation of the memory cell 110" is the following.

During the write operation, the additional word line WLR is set at the logic value 0 (ground voltage), so as to disable the electrical connection between the additional bit line BLR and the latch. Therefore, during the write operation, the operation is quite similar to that previously described for the memory cell 110. During such phase, the additional bit line BLR is pre-charged at the logic value 0, so as to minimize the static power consumption.

During the read operation, instead, the additional bit line BLR is pre-charged at the logic value 1 (supply voltage), and the corresponding additional word line WLR is selected through a signal at the logic value 1 (the word line WL and the bit line pair BL, BL are kept at the logic value 0, so as not to select them during such operation). In this way, the transistor 610 is turned on, while the transistor 615 is turned on or off depending on the logic value being stored by the cell 110 and available at the node IN1. In particular, if the cell stores the logical value 0 (node IN1 at the logic value 1), then the transistor 615 is turned on and the additional bit line will discharge down to the logic value 0 through the series of the transistors 610, 615 being turned on. If instead the memory cell stores the logic value 1 (node IN1 at the logic value 0), then the transistor 615 is turned off and the additional bit line will remain at the (high) pre-charge level.

Equivalent considerations apply in case that there are associated two additional bit lines to each column of memory cells, each one being connected to the memory cells of the column through a respective additional port. In this way, the read operation may occur in a differential mode, similarly to that being described above about the 6T memory cell.

As already described above, such a circuit may not be optimal, since the drawback of indirect access noise during writing may turn out to be so limiting that it allows the use of the 8T memory cells only in the "page-word" SRAM architectures; such architectures, however, are particularly vulnerable to soft error events that may be difficult to correct using the known ECC techniques.

In order to overcome the above-mentioned drawbacks, according to an embodiment, the memory cell 110" of FIG. 6 is modified as shown in FIG. 7. In particular, FIG. 7 shows a schematic representation of a memory cell 110"' formed by the additional port 605 and the latch included in the memory cell 110' of FIG. 3.

As described above, the additional transistors 222, 232 and 228, 234 are activatable by the controlled switches Sp and Sn, respectively.

The operation is substantially equivalent to that described for the memory cell 110", with an advantage that it now has increased read and write noise margins.

As previously mentioned, another embodiment relates to the state of the controlled switches Sn and Sp, depending on the operation state of the memory device in which such memory cells are implemented.

In particular, in the stand-by operation mode, all the controlled switches Sn and Sp are opened, so as not to waste power unnecessarily.

During the writing of a selected memory cell 110"', the controlled switches Sn and Sp of the selected cell are kept opened for maximizing the write noise margins, while all other controlled switches Sp, Sn of the memory cells (within the same row of the selected memory cell) being not selected (that is, not involved in the write operation) are closed. In this way, since the unselected memory cells have wide read noise margins, they will be substantially immune to indirect access noises during the write operation. During reading, all the controlled switches Sn and Sp of the same selected row are closed, so as to further improve the read noise margin with respect to the cell illustrated in FIG. 6.

Such an embodiment may be advantageous in that the memory cells 110"' may be used in SRAM architectures including multiple words per each row of the array. This allows obtaining a SRAM memory device being substantially protected from MBU events; in fact, because of the architecture used, multiple errors on a single row of the array caused by MBU events are probabilistically distributed each one on a different word, thereby making reliable and accurate many ECC correction techniques.

Equivalent considerations apply in the case that the memory cells 110"' include a further additional port adapted to be used during a differential read operation.

It is noted that the same considerations carried out for the embodiment of FIG. 3 may be extended also to the above described embodiment.

In particular, also in this case it is possible to provide for an implementation (not shown in the figure) in which additional transistors are placed only in the pull-down branches or in the pull-up branches, with consequent re-adaptation of the sizing in order to ensure the desired noise margins. Moreover, according to an embodiment (also this one being not shown), the gain factor of at least one between the pull-up and the pull-down branches may be varied by using more than one additional transistor to be inserted in parallel to the transistor forming such branch.

Naturally, in order to satisfy local and specific requirements, one may apply to the embodiments described above many logical and/or physical modifications and alterations. More specifically, although the present disclosure has been described with a certain degree of particularity with reference to embodiments thereof, it should be understood that various omissions, substitutions and changes in the form and details as well as other embodiments are possible. In particular, an embodiment may even be practiced without the specific details set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

For example, similar considerations apply if the memory device has a different structure or includes equivalent components (either separated from each other or combined together, in whole or in part). In particular, the concepts of the present disclosure may be applied to memory cells whose latch is formed by different logic gates, such as for example NAND or NOR logic gates; in this case, the gain factors of the pull-up and pull down branches of such logic gates may be varied by inserting additional transistors in parallel to at least one of the transistors forming such logic gates.

Moreover, the same considerations may apply if the array includes SRAM cells that are not all of the same type; for example, there may be provided both 6T SRAM cells and 8T SRAM cells in properly predefined ratios compatible with the design specifications (for example, the area occupation).

Furthermore, an embodiment of the proposed structure might be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages.

Moreover, an embodiment may be integrated with other circuits in the same chip, or may be mounted in intermediate products (such as mother boards) and coupled with one or more other chips (such as a processor). In any case, the integrated circuit may be suitable for use in complex systems (such as a mobile phone).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A memory cell, comprising:
a first data node;
a pull-up branch coupled to the first a data node;
a pull-down branch coupled to the first data node; and
a impedance adjuster coupled to the first data node;
the memory cell further comprising:
first, second, third, and fourth supply nodes;
a first stage, wherein the first stage comprises:
the pull-up branch comprising a first transistor having a first path node coupled to the first supply node, a second path node coupled to the data node, and a control node; and
the pull-down branch comprising a second transistor having a first path node coupled to the second supply node, a second path node coupled to the data node, and a control node coupled to the control node of the first transistor; and
wherein the impedance adjuster comprises:
a third transistor having a first path node coupled to the third supply node, a second path node coupled to the data node, and a control node coupled to the control nodes of the first and second transistors; and
a fourth transistor having a first path node coupled to the fourth supply node, a second path node coupled to the data node, and a control node coupled to the control nodes of the first and second transistors.

2. The memory cell of claim 1 wherein the pull-down impedance adjusted comprises an impedance relative to the data node.

3. A memory cell, comprising:
a first stage having a data node and a first impedance; and
an impedance adjuster configured to alter the first impedance;
the memory cell further comprising:
first, second, third, and fourth supply nodes;
wherein the first stage comprises:
a first transistor having a first path node coupled to the first supply node, a second path node coupled to the data node, and a control node; and
a second transistor having a first path node coupled to the second supply node, a second path node coupled to the data node, and a control node coupled to the control node of the first transistor; and
wherein the impedance adjuster comprises:
a third transistor having a first path node coupled to the third supply node, a second path node coupled to the data node, and a control node coupled to the control nodes of the first and second transistors; and
a fourth transistor having a first path node coupled to the fourth supply node, a second path node coupled to the data node, and a control node coupled to the control nodes of the first and second transistors.

4. The memory cell of claim 1, further comprising an access transistor having a first path node coupled to the data node, a second path node configured to be coupled to a data line, and a control node configured to be coupled to a word line.

5. The memory cell of claim 1 wherein the first stage comprises a portion of the impedance adjuster.

6. The memory cell of claim 1, further comprising:
a second stage having a complementary data node and a second impedance; and
wherein the impedance adjuster is configured to alter the second impedance.

7. The memory cell of claim 6 wherein:
the first stage comprises an input node coupled to the complementary data node; and
the second stage comprises an input node coupled to the data node.

8. The memory cell of claim 6 wherein the first and second stages respectively comprise first and second inverters.

9. The memory cell of claim 6 wherein the second impedance comprises an impedance relative to the complementary data node.

10. A memory cell, comprising:
a first stage having a data node and a first impedance; and
an impedance adjuster configured to alter the first impedance;
the memory cell further comprising:
a second stage having a complementary data node and a second impedance;
wherein the impedance adjuster is configured to alter the second impedance;
first, second, and third supply nodes;
the first stage comprises:
a first transistor having a first path node coupled to the first supply node, a second path node coupled to the data node, and a control node coupled to the complementary data node; and
a second transistor having a first path node coupled to the second supply node, a second path node coupled to the data node, and a control node coupled to the control node of the first transistor;
the second stage comprises:
a third transistor having a first path node coupled to the first supply node, a second path node coupled to the complementary data node, and a control node coupled to the data node; and
a fourth transistor having a first path node coupled to the second supply node, a second path node coupled to the complementary data node, and a control node coupled to the control node of the third transistor; and
the impedance adjuster comprises:
a fifth transistor having a first path node coupled to the third supply node, a second path node coupled to the data node, and a control node coupled to the control nodes of the first and second transistors; and
a sixth transistor having a first path node coupled to the third supply node, a second path node coupled to the complementary data node, and a control node coupled to the control nodes of the third and fourth transistors.

11. A memory cell, comprising:
a first stage having a data node and a first impedance; and
an impedance adjuster configured to alter the first impedance;
the memory cell further comprising:
a second stage having a complementary data node and a second impedance;
wherein the impedance adjuster is configured to alter the second impedance;
first, second, third, and fourth supply nodes
wherein the first stage comprises:
a first transistor having a first path node coupled to the first supply node, a second path node coupled to the data node, and a control node coupled to the complementary data node; and
a second transistor having a first path node coupled to the second supply node, a second path node coupled to the data node, and a control node coupled to the control node of the first transistor;
wherein the second stage comprises:
a third transistor having a first path node coupled to the first supply node, a second path node coupled to the complementary data node, and a control node coupled to the data node; and
a fourth transistor having a first path node coupled to the second supply node, a second path node coupled to the complementary data node, and a control node coupled to the control node of the third transistor; and
the impedance adjuster comprises:
a fifth transistor having a first path node coupled to the third supply node, a second path node coupled to the data node, and a control node coupled to the control nodes of the first and second transistors;
a sixth transistor having a first path node coupled to the fourth supply node, a second path node coupled to the data node, and a control node coupled to the control nodes of the first and second transistors;
a seventh transistor having a first path node coupled to the third supply node, a second path node coupled to the complementary data node, and a control node coupled to the control nodes of the third and fourth transistors; and
an eighth transistor having a first path node coupled to the fourth supply node, a second path node coupled to the complementary data node, and a control node coupled to the control nodes of the third and fourth transistors.

12. The memory cell of claim 6, further comprising:
wherein the second stage comprises:
a fifth transistor having a first path node coupled to the first supply node, a second path node coupled to the complementary data node, and a control node coupled to the data node; and
a sixth transistor having a first path node coupled to the second supply node, a second path node coupled to the complementary data node, and a control node coupled to the control node of the third transistor; and
the impedance adjuster further comprises:
a switch having a first node coupled to the third supply node and having a second node;
a seventh transistor having a first path node coupled to the third supply node, a second path node coupled to the data node, and a control node coupled to the control nodes of the first and second transistors; and
a eighth transistor having a first path node coupled to the third supply node, a second path node coupled to the complementary data node, and a control node coupled to the control nodes of the third and fourth transistors.

13. The memory cell of claim 6, further comprising:
wherein the second stage comprises:
a fifth transistor having a first path node coupled to the first supply node, a second path node coupled to the complementary data node, and a control node coupled to the data node; and
a sixth transistor having a first path node coupled to the second supply node, a second path node coupled to the complementary data node, and a control node coupled to the control node of the third transistor; and
the impedance adjuster further comprises:
a switch having a first node coupled to the third supply node and having a second node coupled to one of the first and second supply nodes;
a seventh transistor having a first path node coupled to the third supply node, a second path node coupled to the data node, and a control node coupled to the control nodes of the first and second transistors; and
a eighth transistor having a first path node coupled to the third supply node, a second path node coupled to the complementary data node, and a control node coupled to the control nodes of the third and fourth transistors.

14. The memory cell of claim 6, further comprising:
wherein the second stage comprises:
a fifth transistor having a first path node coupled to the first supply node, a second path node coupled to the complementary data node, and a control node coupled to the data node; and a sixth transistor having a first path node coupled to the second supply node, a second path node coupled to the complementary data node, and a control node coupled to the control node of the third transistor; and the impedance adjuster further comprises:

a switch having a first node coupled to the third supply node and having a second node coupled to fourth supply node;

a seventh transistor having a first path node coupled to the third supply node, a second path node coupled to the data node, and a control node coupled to the control nodes of the first and second transistors; and a eighth transistor having a first path node coupled to the third supply node, a second path node coupled to the complementary data node, and a control node coupled to the control nodes of the third and fourth transistors.

15. The memory cell of claim 6, further comprising:

a first access transistor having a first path node coupled to the data node, a second path node configured to be coupled to a data line, and a control node configured to be coupled to a word line; and a second access transistor having a first path node coupled to the complementary data node, a second path node configured to be coupled to a complementary data line, and a control node configured to be coupled to the word line.

16. The memory cell of claim 6 wherein:

the first stage comprises a first portion of the impedance adjuster; and the second stage comprises a second portion of the impedance adjuster.

17. An integrated circuit, comprising:

a first data line; and a first memory cell, comprising:

a first stage having a pull-up branch and a pull-down branch coupled to a data node, the pull-up branch and the pull-down branch each having a first impedance; and an impedance adjuster coupled the pull-up branch and coupled to the pull-down branch and each configured to alter the respective first impedances;

first, second, third, and fourth supply nodes;

a word line;

wherein the first stage comprises:

a first transistor having a first path node coupled to the first supply node, a second path node coupled to the data node, and a control node; and a second transistor having a first path node coupled to the second supply node, a second path node coupled to the data node, and a control node coupled to the control node of the first transistor:

a third transistor coupled between the data line and the data node and having a control node coupled to the word line; and wherein the impedance adjuster comprises:

a fourth transistor having a first path node coupled to the third supply node, a second path node coupled to the data node, and a control node coupled to the control nodes of the first and second transistors; and a fifth transistor having a first path node coupled to the fourth supply node, a second path node coupled to the data node, and a control node coupled to the control nodes of the first and second transistors.

18. The integrated circuit of claim 17 wherein the first impedance comprises an impedance relative to the data node.

19. An integrated circuit, comprising:

a first data line; and a first memory cell, comprising:

a first stage having a first impedance and having a data node coupled to the data line; and a first impedance adjuster configured to alter the first impedance;

first, second, third, and fourth supply nodes;

a word line;

wherein the first stage comprises:

a first transistor having a first path node coupled to the first supply node, a second path node coupled to the data node, and a control node; and a second transistor having a first path node coupled to the second supply node, a second path node coupled to the data node, and a control node coupled to the control node of the first transistor;

a third transistor coupled between the data line and the data node and having a control node coupled to the word line; and wherein the first impedance adjuster comprises:

a fourth transistor having a first path node coupled to the third supply node, a second path node coupled to the data node, and a control node coupled to the control nodes of the first and second transistors; and a fifth transistor having a first path node coupled to the fourth supply node, a second path node coupled to the data node, and a control node coupled to the control nodes of the first and second transistors.

20. The integrated circuit of claim 17, further comprising:

a complementary data line; and wherein the memory cell further comprises:

a second stage having a second impedance and having a complementary data node coupled to the complementary data line; and wherein the impedance adjuster is configured to alter the second impedance.

21. The integrated circuit of claim 20 wherein:

the first stage comprises an input node coupled to the complementary data node; and the second stage comprises an input node coupled to the data node.

22. The integrated circuit of claim 20, further comprising:

the second stage comprises:

a sixth transistor having a first path node coupled to the first supply node, a second path node coupled to the complementary data node, and a control node coupled to the data node; and a seventh transistor having a first path node coupled to the second supply node, a second path node coupled to the complementary data node, and a control node coupled to the control node of the third transistor;

a eighth transistor coupled between the complementary data line and the complementary data node and having a control node coupled to the word line; and the impedance adjuster further comprises:

a ninth transistor having a first path node coupled to the third supply node, a second path node coupled to the data node, and a control node coupled to the control nodes of the first and second transistors; and an tenth transistor having a first path node coupled to the third supply node, a second path node coupled to the complementary data node, and a control node coupled to the control nodes of the fourth and fifth transistors.

23. An integrated circuit, comprising:
a first data line; and
a first memory cell, comprising:
a first stage having a first impedance and having a data node coupled to the data line; and
a first impedance adjuster configured to alter the first impedance;
a complementary data line; and
wherein the memory cell further comprises:
a second stage having a second impedance and having a complementary data node coupled to the complementary data line; and
wherein the impedance adjuster is configured to alter the second impedance; first, second, third, and fourth supply nodes;
a word line;
wherein the first stage comprises:
a first transistor having a first path node coupled to the first supply node, a second path node coupled to the data node, and a control node coupled to the complementary data node; and
a second transistor having a first path node coupled to the second supply node, a second path node coupled to the data node, and a control node coupled to the control node of the first transistor;
a third transistor coupled between the data line and the data node and having a control node coupled to the word line;
wherein the second stage comprises:
a fourth transistor having a first path node coupled to the first supply node, a second path node coupled to the complementary data node, and a control node coupled to the data node; and
a fifth transistor having a first path node coupled to the second supply node, a second path node coupled to the complementary data node, and a control node coupled to the control node of the third transistor;
a sixth transistor coupled between the complementary data line and the complementary data node and having a control node coupled to the word line; and
the impedance adjuster comprises:
a seventh transistor having a first path node coupled to the third supply node, a second path node coupled to the data node, and a control node coupled to the control nodes of the first and second transistors;
an eighth transistor having a first path node coupled to the fourth supply node, a second path node coupled to the data node, and a control node coupled to the control nodes of the first and second transistors;
a ninth transistor having a first path node coupled to the third supply node, a second path node coupled to the complementary data node, and a control node coupled to the control nodes of the fourth and fifth transistors; and
a tenth transistor having a first path node coupled to the fourth supply node, a second path node coupled to the complementary data node, and a control node coupled to the control nodes of the fourth and fifth transistors.

24. The integrated circuit of claim 20, further comprising:
wherein the second stage comprises:
a sixth transistor having a first path node coupled to the first supply node, a second path node coupled to the complementary data node, and a control node coupled to the data node; and
a seventh transistor having a first path node coupled to the second supply node, a second path node coupled to the complementary data node, and a control node coupled to the control node of the fourth transistor;
a eighth sixth transistor coupled between the complementary data line and the complementary data node and having a control node coupled to the word line; and
the impedance adjuster comprises:
a switch having a first node coupled to the third supply node and having a second node coupled to fourth supply node;
a ninth transistor having a first path node coupled to the third supply node, a second path node coupled to the data node, and a control node coupled to the control nodes of the first and second transistors; and
an tenth eighth transistor having a first path node coupled to the third supply node, a second path node coupled to the complementary data node, and a control node coupled to the control nodes of the fourth and fifth transistors.

25. The integrated circuit of claim 17, further comprising:
a second data line;
a second memory cell, comprising:
a second stage having a second impedance and having a data node coupled to the second data line; and
a second impedance adjuster configured to alter the second impedance; and
a control circuit configured to cause the first and second impedance adjusters to reduce the first and second impedances, respectively, during a reading of the first memory cell.

26. The integrated circuit of claim 17, further comprising:
a second data line;
a second memory cell, comprising:
a second stage having a second impedance and having a data node coupled to the second data line; and
a second impedance adjuster configured to alter the second impedance; and
a control circuit configured to cause the first impedance adjuster to not reduce the first impedance and to cause the second impedance adjuster to reduce the second impedance during a writing of the first memory cell.

* * * * *